(12) United States Patent
Kobayashi et al.

(10) Patent No.: US 9,979,384 B2
(45) Date of Patent: May 22, 2018

(54) TIMING ADJUSTMENT METHOD FOR DRIVE CIRCUIT AND TIMING ADJUSTMENT CIRCUIT FOR DRIVE CIRCUIT

(71) Applicant: DENSO CORPORATION, Kariya, Aichi-pref. (JP)

(72) Inventors: Atsushi Kobayashi, Kariya (JP); Kiyoshi Yamamoto, Kariya (JP); Atsushi Kanamori, Kariya (JP); Sadahiro Akama, Kariya (JP)

(73) Assignee: DENSO CORPORATION, Kariya (JP)

( * ) Notice: Subject to any disclaimer, the term of this patent is extended or adjusted under 35 U.S.C. 154(b) by 115 days.

(21) Appl. No.: 15/122,438

(22) PCT Filed: Apr. 2, 2015

(86) PCT No.: PCT/JP2015/001889
§ 371 (c)(1),
(2) Date: Aug. 30, 2016

(87) PCT Pub. No.: WO2015/155962
PCT Pub. Date: Oct. 15, 2015

(65) Prior Publication Data
US 2017/0093392 A1    Mar. 30, 2017

(30) Foreign Application Priority Data
Apr. 11, 2014   (JP) .................................. 2014-081890

(51) Int. Cl.
*H03K 19/00*    (2006.01)
*H03K 17/16*    (2006.01)
(Continued)

(52) U.S. Cl.
CPC ........... *H03K 17/162* (2013.01); *H03K 3/012* (2013.01); *H03K 5/1534* (2013.01);
(Continued)

(58) Field of Classification Search
CPC ...................................................... H03K 19/00
See application file for complete search history.

(56) References Cited

U.S. PATENT DOCUMENTS 5,986,484 A    11/1999 Kimata
8,461,881 B2 *  6/2013 Park .................... H03K 17/795
                                                        327/108

(Continued)

FOREIGN PATENT DOCUMENTS

JP         3141613 B2   12/2000
JP      2002-369495 A   12/2002
(Continued)

*Primary Examiner* — Hai L Nguyen
(74) *Attorney, Agent, or Firm* — Posz Law Group, PLC

(57) ABSTRACT

A timing adjustment method for a drive circuit, including: a rise detector for a rise start when a voltage-driven semiconductor element is turned off; a timing signal output unit outputting a speed change timing signal after a set delay time has elapsed from the rise start; and a conduction controller for a conduction control terminal of the semiconductor element using the timing signal, comprises: defining an estimated terminal voltage of the conduction control terminal when a rise completion time elapses; increasing a delay time by a predetermined unit time, and changing the drive signal to a turning off level again, when the conduction control terminal doesn't fall below the estimated terminal voltage after the drive signal is changed to a turning off level before the level is inverted; and determining a delay time, when the conduction control terminal falls below the estimated terminal voltage initially, as a set value.

9 Claims, 7 Drawing Sheets

(51) Int. Cl.
　　　*H03K 3/012*　　　(2006.01)
　　　*H03K 5/1534*　　(2006.01)
　　　*H03K 17/28*　　　(2006.01)
(52) U.S. Cl.
　　　CPC ......... *H03K 17/163* (2013.01); *H03K 17/168* (2013.01); *H03K 17/28* (2013.01)

(56) References Cited

U.S. PATENT DOCUMENTS

| 8,717,068 B2 * | 5/2014 | Wasekura ............ H03K 17/163 327/108 |
|---|---|---|
| 2007/0115038 A1 | 5/2007 | Higashi et al. |

FOREIGN PATENT DOCUMENTS

| JP | 2004-072635 A | 3/2004 |
|---|---|---|
| JP | 2008-078816 A | 4/2008 |

\* cited by examiner

TIMING ADJUSTMENT METHOD FOR DRIVE CIRCUIT AND TIMING ADJUSTMENT CIRCUIT FOR DRIVE CIRCUIT

CROSS REFERENCE TO RELATED APPLICATIONS

This application is a U.S. national stage application of International Patent Application No. PCT/JP2015/001889 filed on Apr. 2, 2015 and is based on Japanese Patent Application No. 2014-81890 filed on Apr. 11, 2014, the disclosure of which is incorporated herein by reference.

TECHNICAL FIELD

The present disclosure relates to a method and a circuit for adjusting a timing of changing a turning-off speed midway when a drive circuit turns off a voltage-driven semiconductor element.

BACKGROUND

There is active gate control as a technique for reducing a switching loss during turning-off in a circuit that drives a voltage-driven semiconductor element such as an IGBT. For example, in Patent Literature 1, a delay device (a capacitor C1) sets a delay time so that a switching speed can be switched to a low speed when a collector voltage reaches a high-side voltage after the detection of a rise of a collector-emitter voltage VCE of the IGBT.

However, in the configuration of Patent Literature 1, when the rise time of the collector voltage varies due to variations in the gate capacitance of the IGBT or the drive current, a timing of switching the switching speed is shifted. Thus, a reduction of the switching loss may become insufficient, or an increase of a surge voltage may occur.

PATENT LITERATURE

Patent Literature 1: JP-2007-142788-A

SUMMARY

It is an object of the present disclosure to provide a timing adjustment method for a drive circuit and a timing adjustment circuit for a drive circuit capable of appropriately performing adjustment of a delay time that is applied to a drive signal for switching a switching speed during turning-off according to the characteristics of a voltage-driven semiconductor element and a drive circuit actually used.

According to an aspect of the present disclosure, a timing adjustment method for a drive circuit which includes: a rise detection unit that detects a rise start of an inter-conduction-terminal voltage of a voltage-driven semiconductor element when the voltage-driven semiconductor element is turned off; a timing signal output unit that outputs a speed change timing signal after a set delay time has elapsed from detection of the rise start; and a conduction control unit that initially discharges a conduction control terminal of the voltage-driven semiconductor element at a high speed, and changes a discharge speed to a low speed after the speed change timing signal is input, when the voltage-driven semiconductor element is turned off in response to an input drive signal, the timing adjustment method of adjusting a delay time set to the timing signal output unit comprises: defining a time interval, from the rise start of the inter-conduction terminal voltage until the inter-conduction terminal voltage reaches a power supply voltage supplied to a high-potential side conduction terminal, as a rise completion time; defining a voltage of the conduction control terminal, estimated at time point when the rise completion time elapses, as an estimated terminal voltage; outputting the drive signal, having a level for turning off the voltage-driven semiconductor element, from a pulse generation circuit to the driving circuit for a predetermined time period when a test mode signal is at a high level; increasing a delay time, set to the timing signal output unit, by a predetermined unit time, and changing the drive signal, outputted from the pulse generation circuit, to a level for turning off the voltage-driven semiconductor element again, when the voltage of the conduction control terminal does not fall below the estimated terminal voltage after the drive signal is changed to a level for turning off the voltage-driven semiconductor element before the level is inverted; and determining a delay time, set at a time point when the voltage of the conduction control terminal falls below the estimated terminal voltage for the first time, as a value fixedly set to the timing signal output unit.

According to another aspect of the present disclosure, a timing adjustment circuit for a drive circuit which includes: a rise detection unit that detects a rise start of an inter-conduction-terminal voltage of a voltage-driven semiconductor element when the voltage-driven semiconductor element is turned off; a timing signal output unit that outputs a speed change timing signal after a set delay time has elapsed from detection of the rise start; and a conduction control unit that initially discharges a conduction control terminal of the voltage-driven semiconductor element at a high speed, and changes a discharge speed to a low speed after the speed change timing signal is input, when the voltage-driven semiconductor element is turned off in response to an input drive signal, the timing adjustment circuit of adjusting a delay time set to the timing signal output unit comprises: a pulse generation circuit that outputs the drive signal, having a level for turning off the voltage-driven semiconductor element, to the driving circuit for a predetermined time period when a test mode signal is at a high level; a comparator that outputs a detection signal when a voltage of the conduction control terminal falls below an estimated terminal voltage, wherein the estimated terminal voltage is obtained by estimating a voltage of the conduction control terminal at a time point when a rise completion time elapses, and a time interval, from the rise start of the inter-conduction terminal voltage until the inter-conduction-terminal voltage reaches a power supply voltage supplied to a high-potential side conduction terminal, is defined as the rise completion time when the voltage-driven semiconductor element is turned off; and a delay time setting device that: increases a delay time, set to the timing signal output unit, by a predetermined unit time when the detection signal, outputted from the pulse generation circuit is not output after the drive signal, outputted from the pulse generation circuit, is changed to a level for turning off the voltage-driven semiconductor element before the level is inverted; and fixedly sets the delay time, set at a time point when the detection signal is output for the first time, to the timing signal output unit.

When the voltage of the conduction control terminal does not fall below the estimated terminal voltage VT during a period between when the drive signal is changed to a level for turning off the voltage-driven semiconductor element and when the level is inverted, the timing of switching the discharge speed from a high speed to a low speed is early, and the voltage of the conduction control terminal thus does not reach the estimated terminal voltage before the inversion of the level of the drive signal.

Further, the delay time set at the point of time when the voltage of the conduction control terminal falls below the estimated terminal voltage for the first time is a time that makes the timing of switching the discharge speed from a high speed to a low speed exactly coincide with the rise completion time. Thus, the delay time is determined as a value fixedly set to the timing signal output unit. Accordingly, it is possible to appropriately set the timing of switching the discharge speed during turning-off from a high speed to a low speed by the drive circuit according to the characteristics of the voltage-driven semiconductor element and the drive circuit actually used.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

First Embodiment

Figure 1:
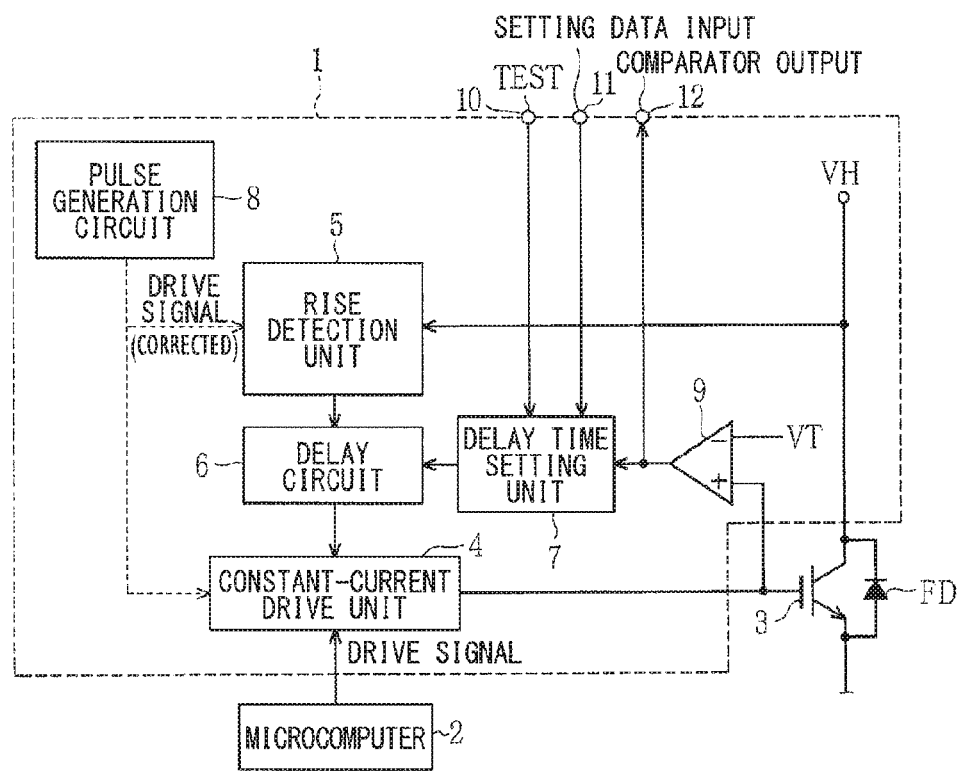
FIG. 1 is a function block diagram illustrating an electrical configuration of a gate drive circuit according to a first embodiment.

As illustrated in FIG. 1, a gate drive circuit 1 which is an adjustment target of the present disclosure turns on and turns off an IGBT 3 (a voltage-driven semiconductor element) according to a drive signal input from a microcomputer 2. The drive signal is output to a gate (a conduction control terminal) of the IGBT 3 through a constant-current drive unit 4 (conduction control unit). That is, the gate drive circuit 1 is adjusted by a timing adjustment method and a timing adjustment circuit described below. A collector of the IGBT 3 is connected to a high-potential power supply VH, and an emitter of the IGBT 3 is connected to, for example, a load (not illustrated) (high-side driving). Further, a free-wheel diode FD is connected between the collector and the emitter.

The constant-current drive unit 4 charges the gate of the IGBT 3 with a constant current so as to be turned on, and discharges (that is, a discharging operation) the gate of the IGBT 3 with a constant current so as to be turned off. In the turning-off, switching is performed in such a manner that the gate is first discharged at a high speed, and then discharged at a low speed. That is, active gate control which changes a constant current amount (switching speed) for discharging the gate midway is performed.

Figure 7A:
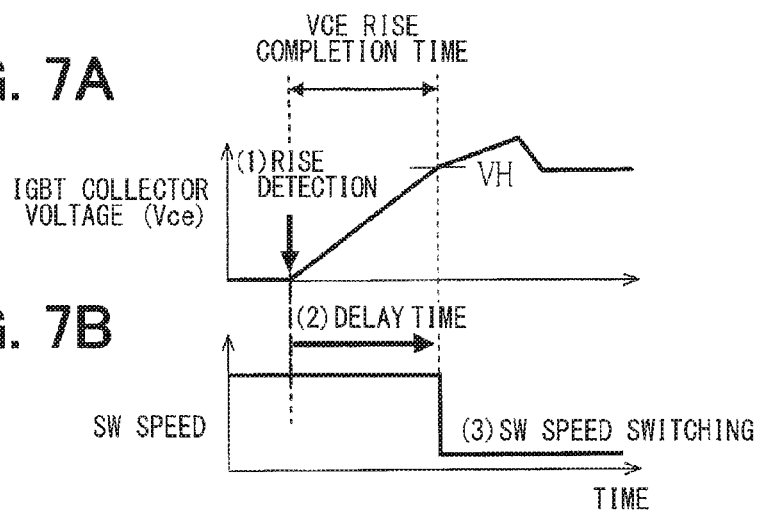
FIG. 7A is a diagram illustrating a change in collector-emitter voltage VCE.
Figure 7B:
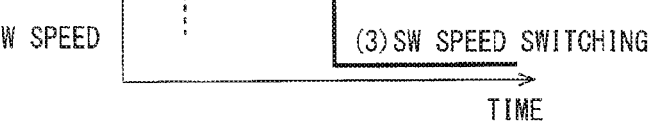
FIG. 7B is a diagram illustrating a change in discharge speed during turning-off of an IGBT.

A rise detection unit 5 detects a rise start of a collector-emitter voltage VCE (an inter-conduction terminal voltage) of the IGBT 3 when the IGBT 3 is turned off. As illustrated in FIGS. 7A and 7B, a delay circuit 6 (a timing signal output unit, a delay time setting device) outputs a speed change timing signal (hereinbelow, merely referred to as a "timing signal") to the constant-current drive unit 4 (3) upon the lapse of a delay time set by a delay time setting unit 7 (a delay time setting device) (2) from a point of time when the rise detection unit 5 detects the rise start (1). Accordingly, the constant-current drive unit 4 changes the discharge speed from a high speed to a low speed. In FIGS. 7A and 7B, a time between the rise start of the voltage VCE and when the voltage VCE becomes equal to a voltage VH supplied to the collector of the IGBT 3 is defined as a rise completion time $t_E$.

A pulse generation circuit 8 is connected for outputting a drive signal in place of the microcomputer 2 when adjustment of the gate drive circuit 1 is performed. The drive signal is input also to the rise detection unit 5 so as to be used when adjustment described below is performed. A comparator 9 is connected also when the above adjustment is performed and compares a gate voltage of the IGBT 3 with a threshold voltage VT during turning-off. When the former voltage falls below the latter voltage, an output signal level is changed from high to low (a detection signal). The delay time setting unit 7 determines a delay time set to the delay circuit 6 according to a change in the output signal of the comparator 9.

The gate drive circuit 1 is provided with input terminals 10, 11 and an output terminal 12. The input terminal 10 is a terminal for inputting a TEST mode signal (high active) to the delay time setting unit 7 from the outside. The input terminal 11 is a terminal for inputting setting data corresponding to the delay time to the delay time setting unit 7 from the outside. The output terminal 12 is a terminal for observing an output signal of the comparator 9 in the outside.

Figure 2:
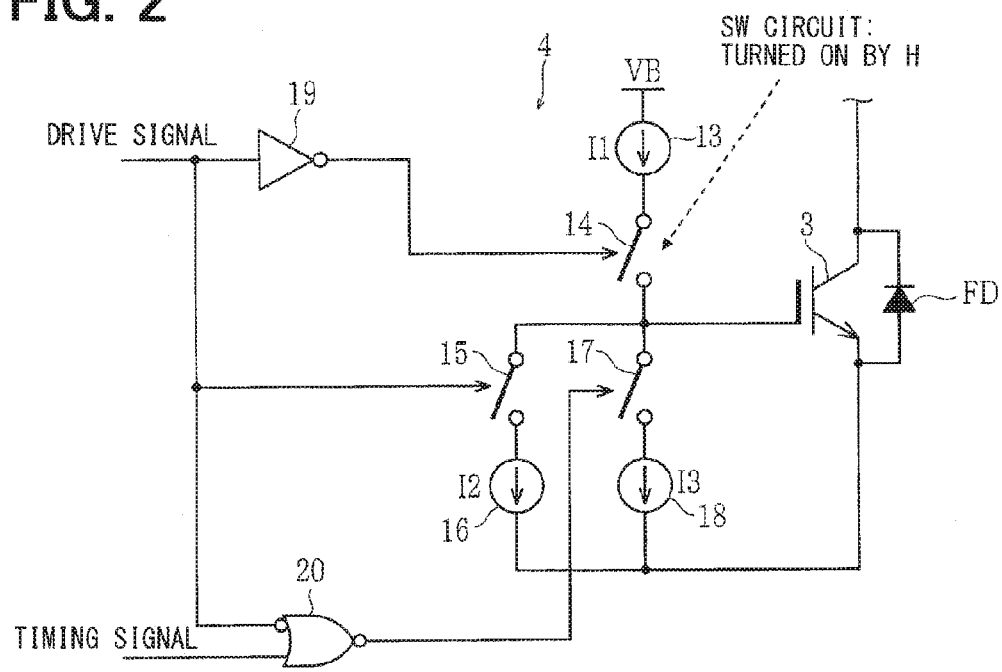
FIG. 2 is a diagram illustrating an electrical configuration of a constant-current drive unit.

As illustrated in FIG. 2, in the constant-current drive unit 4, a series circuit of a constant-current source 13 (I1) and a switch circuit 14 is connected between a driving power supply VB and the gate of the IGBT 3. A series circuit of a switch circuit 15 and a constant-current source 16 (I2) and a series circuit of a switch circuit 17 and a constant-current source 18 (I3) are connected in parallel between the gate and the emitter of the IGBT 3.

An input drive signal is applied to an input terminal of a NOT gate 19 and a negative logic input terminal of a NOR gate 20 and directly controls on/off of the switch circuit 15. A timing signal output from the delay circuit 6 is input to a positive logic input terminal of the NOR gate 20. An output signal of the NOT gate 19 controls on/off of the switch circuit 14. An output signal of the NOR gate 20 controls on/off of the switch circuit 17.

That is, when the drive signal is at a low level, the output of the NOT gate 19 becomes a high level and the output of the NOR gate becomes a low level, so that only the switch circuit 14 is turned on. Thus, the gate of the IGBT 3 is charged with the constant current I1, and the IGBT 3 is turned on. On the other hand, when the drive signal is at a high level and the timing signal is at a low level, the output of the NOT gate 19 becomes a low level and the output of the NOR gate 20 becomes a high level, so that the switch circuits 15 and 17 are turned on. Thus, the gate of the IGBT 3 is discharged with a constant current (I2+I3) at a high speed, and the IGBT 3 is turned off.

When the drive signal and the timing signal are at a high level, the output of the NOR gate 20 becomes a low level. Thus, only the switch circuit 15 is turned on. Thus, the gate of the IGBT 3 is discharged with the constant current I2 at a low speed.

Figure 3:
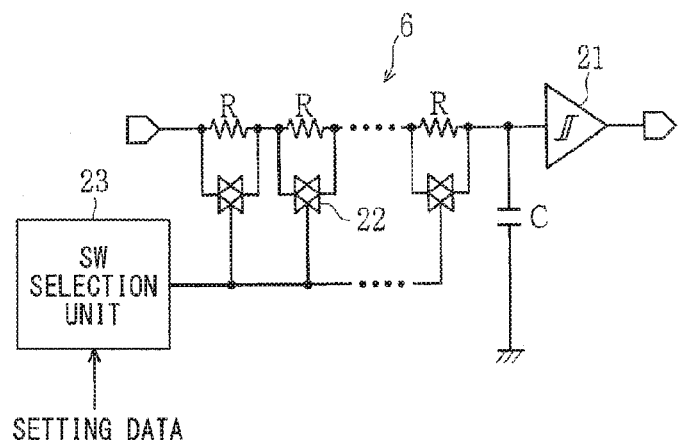
FIG. 3 is a diagram illustrating an electrical configuration of a delay circuit.

As illustrated in FIG. 3, the delay circuit 6 includes an integration circuit which includes a plurality of resistance elements R, a capacitor C and a Schmitt trigger buffer 21, a plurality of switch circuits (analog switches) 22 each of which is connected to both ends of the corresponding one of the resistance elements R, and an SW selection unit 23 which selectively controls on/off of the switch circuits 22. The SW selection unit 23 controls on/off of the switch circuits 22 according to setting data input from the delay time setting unit 7. A rise detection signal for the drive signal input from the rise detection unit 5 is input to the first-stage resistance element R. That is, when the switch circuit 22 is turned on and the resistance element R is short-circuited, which reduces the substantial number of series resistance elements, the delay time becomes shorter. When the switch circuit 22 is turned off, which increases the substantial number of series resistance elements, the delay time becomes longer.

Figure 4:
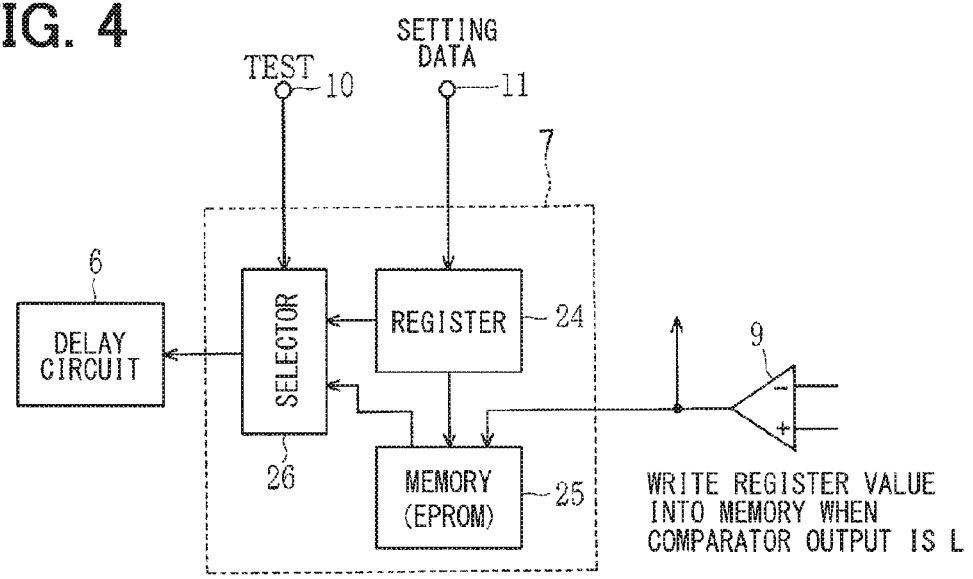
FIG. 4 is a diagram illustrating an electrical configuration of a delay time setting unit.

As illustrated in FIG. 4, the delay time setting unit 7 includes a data register 24, a memory (an EPROM, for example) 25, and a selector 26. Setting data input from the outside is stored in the data register 24, and the stored data is directly input to the memory 25. When the output signal of the comparator 9 presents a low level, data is written into the memory 25.

When the comparator 9 is an element that is connected only during the execution of a TEST mode, the terminal of the memory 25 may be pulled up to prohibit writing thereafter. When the comparator 9 is always mounted on the gate drive circuit 1, writing to the memory 25 is performed, for example, under an AND condition with a TEST mode signal.

The selector 26 outputs either data input from the data register 24 or data input from the memory 25 to the delay circuit 6. The selector 26 selects the data register 24 when the TEST mode signal is at a high level and selects the memory 25 when the TEST mode signal is at a low level.

Here, the threshold voltage VT set to the comparator 9 will be described. When VG denotes a gate voltage of the IGBT 3, IG denotes a drive current (discharge current) during turning-off, and Ciss denotes an input capacitance of the IGBT 3, a change in the voltage VG according to time t [s] is represented by the following equation.

$$VG = VB - (IG/Ciss) \times t \quad (2)$$

As can be seen from Equation (2), variations in the input capacitance Ciss of the IGBT 3 and the drive current IG appear as variations in change of the gate voltage VG.

The rise completion time $t_E$ is determined by the following equation, where Crss denotes a feedback capacitance of the IGBT 3.

$$t_E = VH \times Crss/IG \quad (3)$$

Further, Equation (4) is obtained by substituting Equation (3) into the time t on the right side of Equation (2).

$$VG = VB - VH \times Crss/Ciss \quad (4)$$

The gate voltage VG represented by Equation (4) is a gate voltage that is estimated to be reached at the point of time when the collector-emitter voltage VCE of the IGBT 3 becomes equal to the power supply voltage VH and defined as an estimated gate voltage VT (estimated terminal voltage).

$$VT = VB - VH \times Crss/Ciss \quad (1)$$

The estimated gate voltage VT is defined as a threshold voltage of the comparator 9.

It is considered that the feedback capacitance Crss and the input capacitance Ciss of the IGBT 3 vary in the same increase/decrease direction and with the same proportion. Thus, the ratio Crss/Ciss therebetween is a fixed value. Since these values are obtained according to a design condition of the IGBT 3, all the values on the right side of Equation (1) are known values. Thus, the threshold voltage VT of the comparator 9 can be set.

Figure 5:
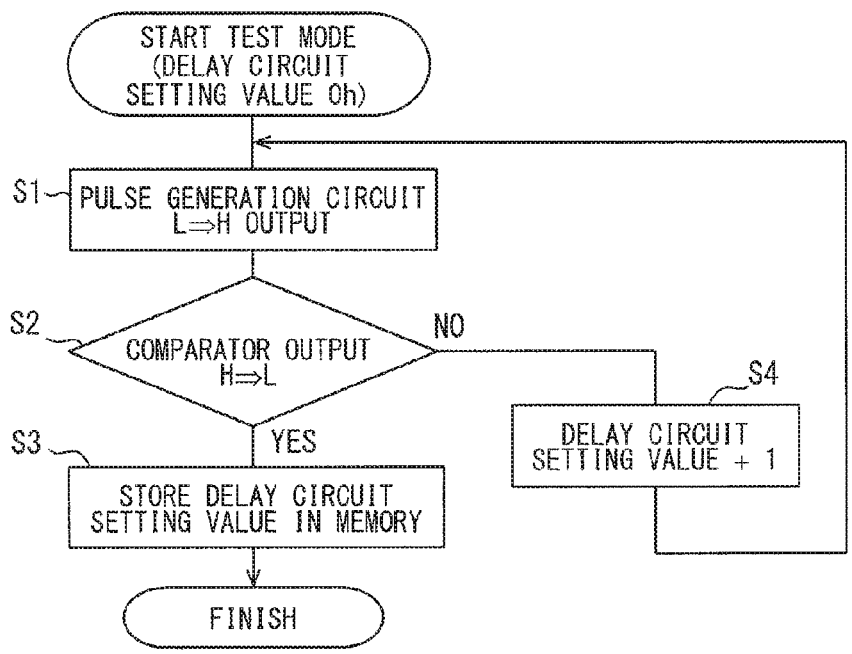
FIG. 5 is a flow chart illustrating adjustment processing (TEST mode)

Next, the action of the present embodiment will be described. As illustrated in FIG. 5, the input terminal 10 of the gate drive circuit 1 is brought into a high level to set the TEST mode (timing adjustment period). Further, an initial value 0h is stored in the register 24 through the input terminal 11. Then, the pulse generation circuit 8 outputs an adjustment drive signal (S1). An operator connects a measuring instrument such as an oscilloscope to the output terminal 12 to check whether the output signal of the comparator 9 has changed from a high level to a low level (S2). The check is performed while the drive signal is at a high level.

When the output signal of the comparator 9 does not change to a low level (S2: NO), a data value to be stored in the register 24 is incremented to increase the delay time by a unit time (S4), and a return to step S1 is made. When the output signal of the comparator 9 has changed to the low level (S2: YES), data stored in the register 24 at this point of time is stored in the memory 25 (S3). An operator checks a change in the signal in the output terminal 12 and finishes the operation. When the adjustment processing is finished and the input terminal 10 is pulled down, data stored in the memory 25 is output to the delay circuit 6 through the selector 26 thereafter.

Figure 6:
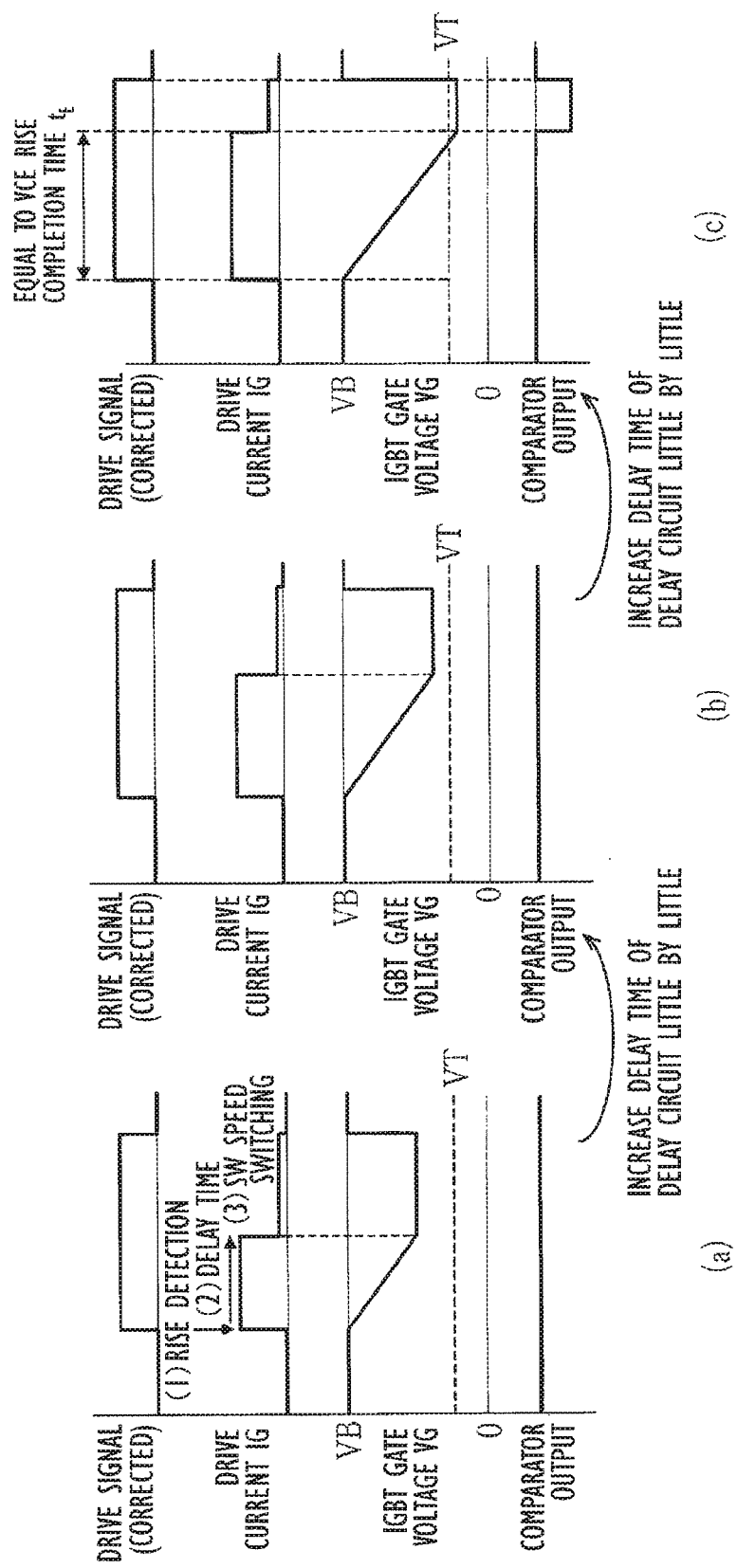
FIG. 6 is a timing charts illustrating a change in each signal corresponding to the processing of FIG. 5.

As illustrated in FIG. 6, a high-level pulse width of the drive signal during adjustment is set to be slightly long taking into consideration a variation in the collector-emitter voltage VCE. When the IGBT 3 is in an on state, the gate voltage VG is charged with the driving power supply voltage VB of the constant-current drive unit 4. When the drive signal changes to a high level, the gate is discharged at a high speed at the beginning to rapidly reduce the gate voltage VG. When the timing signal is output upon the lapse of a delay time set to the delay circuit 6, the discharge speed is switched to a low speed, and the gate voltage VG is hardly reduced.

As illustrated in (a) of FIG. 6, when the timing signal is output at an early stage, the gate voltage VG is reduced only up to a voltage higher than the threshold voltage VT, and the output signal of the comparator 9 remains unchanged at a high level. When the delay time is increased from this state to further delay the output of the timing signal, the gate voltage VG is further reduced in response thereto. As illustrated in (c) of FIG. 6, when the gate voltage VG is reduced to the threshold voltage VT, the output signal of the comparator 9 changes to a low level. The delay time set at this point of time is equal to the rise completion time $t_E$. Thus, the delay time is optimally determined by performing adjustment in accordance with the flow illustrated in FIG. 5.

As described above, according to the present embodiment, a time between the rise start of the collector-emitter voltage VCE and when the collector-emitter voltage VCE rises to the power supply voltage VH when the IGBT 3 is turned off is defined as the rise completion time $t_E$, and a gate voltage obtained by estimating the gate voltage VG at the point of time when the rise completion time $t_E$ elapses is defined as the estimated gate voltage VT.

When the gate voltage VG does not fall below the estimated gate voltage VT during a period between when the drive signal is changed to a high level for turning off the IGBT 3 and when the drive signal is changed to a low level, the delay time set to the delay circuit 6 is increased by a predetermined unit time, and the drive signal is then again changed as described above, and the delay time set at the point of time when the gate voltage VG falls below the estimated terminal voltage VT for the first time is determined as a value fixedly set to the delay circuit 6.

Thus, it is possible to appropriately set a timing for switching the discharge speed during turning-off from a high speed to a low speed by the gate drive circuit 1 according to the characteristics of the IGBT 3 and the gate drive circuit 1 actually used. Further, the estimated gate voltage VT is set on the basis of Equation (1). Thus, the threshold voltage VT of the comparator 9 can be clearly set on the basis of the values which are all known.

The delay time setting unit 7 includes the data register 24, the memory 25, and the selector 26. The delay circuit 6 is configured to have a delay time changed by changing a CR time constant. In the TEST mode, the data value set to the data register 24 is increased by a predetermined value, and the data value stored in the data register 24 is output to the delay circuit 6 through the selector 26. When the output signal of the comparator 9 is changed to a low level for the first time, the data value stored in the data register 24 is written into the memory 25. When the TEST mode is finished, the data value written in the memory 25 is output to the delay circuit 6 through selector 26. Thus, adjustment and determination of the delay time can be easily performed.

Second Embodiment

Figure 8:
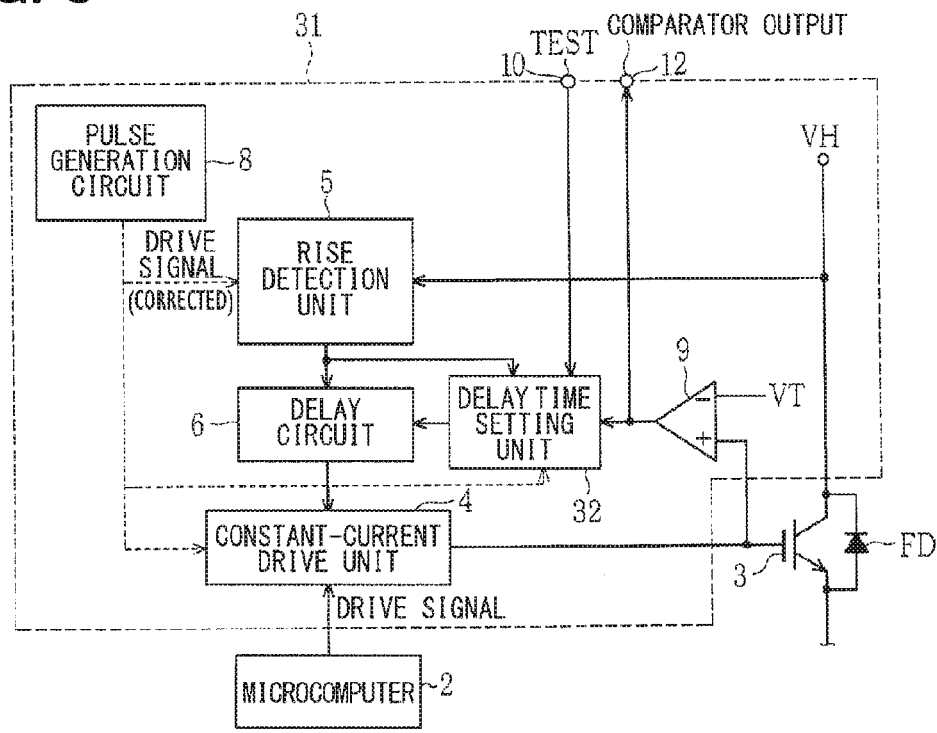
FIG. 8 is a function block diagram illustrating an electrical configuration of a gate drive circuit according to a second embodiment.

Hereinbelow, the same part as the first embodiment will be designated by the same reference sign and description thereof will be omitted. Thus, a part different from the first embodiment will be described. As illustrated in FIG. 8, in a gate drive circuit 31 of a second embodiment, the delay time setting unit 7 is replaced with a delay time setting unit 32. Further, the input terminal 11 is not provided. A rise detection signal output from a rise detection unit 5, a drive signal output from a pulse generation circuit 8, and an output signal of a comparator 9 are input to the delay time setting unit 32.

Figure 9:
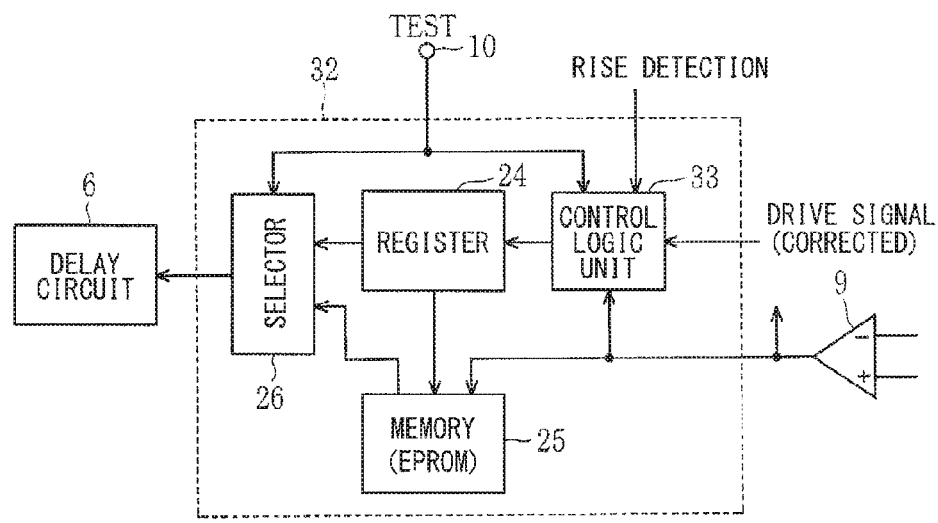
FIG. 9 is a diagram illustrating an electrical configuration of a delay time setting unit.

As illustrated in FIG. 9, the delay time setting unit 32 is obtained by adding a control logic unit 33 to the delay time setting unit 7. A TEST mode signal, a rise detection signal, and a drive signal are input to the control logic unit 33. The control logic unit 33 is configured to automatically perform data setting with respect to a data register 24, and the operation contents thereof are the same as those in the flow chart illustrated in FIG. 5.

Next, the action of the second embodiment will be described. The control logic unit 33 is enabled when the TEST mode signal becomes a high level to start the processing illustrated in FIG. 5. The data register 24 is cleared in an initial state, and an initial value thereof is 0h. The control logic unit 33 monitors whether the output signal of the comparator 9 changes to a low level during a period between when the rise detection signal is input and when the drive signal changes to a low level. When the output signal does not change to a low level, the control logic unit 33 increments the data value from 0h and stores the incremented data value in the data register 24. Upon detecting that the output signal of the comparator 9 has changed to a low level, the control logic unit 33 finishes the operation.

In this case, an operator may refer to a signal change in the output terminal 12 to confirm that the adjustment processing inside the delay time setting unit 32 has been finished and may pull down the input terminal 10 in accordance with the confirmation of the finish. When there is no problem in ignoring a difference between a timing of the input of the rise detection signal and a rise time of the drive signal which is directly input, the input of the rise detection signal may be omitted.

As described above, according to the second embodiment, the delay time setting unit 32 automatically performs update of data stored in the data register 24 during the TEST mode. Thus, adjustment can be more easily performed.

Third Embodiment

Figure 10:
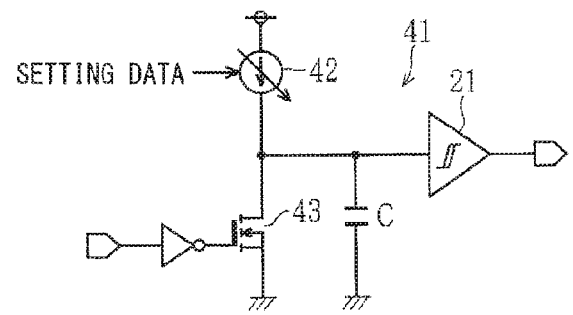
FIG. 10 is a diagram illustrating an electrical configuration of a delay circuit according to a third embodiment.

The following third to fifth embodiments show variations in the configuration of the delay circuit. As illustrated in FIG. 10, a delay circuit 41 (a delay time setting device) of the third embodiment includes a series circuit of a variable constant-current source 42 (or a variable current source) and a capacitor C, the series circuit being connected between a power supply and the ground, a Schmitt trigger buffer 21 which includes an input terminal connected to a common connection point between the variable constant-current source 42 and the capacitor C, and an N-channel MOSFET 43 which is connected in parallel to the capacitor C. A rise detection signal is input to a gate of the N-channel MOSFET 43. A constant-current value of the variable constant-current source 42 is determined according to setting data of the delay time.

That is, when no rise detection signal is input, the N-channel MOSFET 43 is in an on state, and the capacitor C is thus not charged. When the rise detection signal is input, the N-channel MOSFET 43 is turned off, and the capacitor C is charged by the variable constant-current source 42. In this case, as the constant-current value decreases, the delay time becomes longer. On the other hand, as the constant-current value increases, the delay time becomes shorter. Thus, data is decoded so that the setting data value and the large-small relationship of the delay time are consistent with each other, and the decoded data is output to the variable constant-current source 42.

As described above, according to the third embodiment, the delay circuit 41 includes the series circuit of the variable constant-current source 42 and the capacitor C, and the delay time is changed by changing the current value of the variable constant-current source 42 according to the setting of the delay time. Thus, the same effect as that of the first embodiment or the second embodiment can be obtained.

Fourth Embodiment

Figure 11:
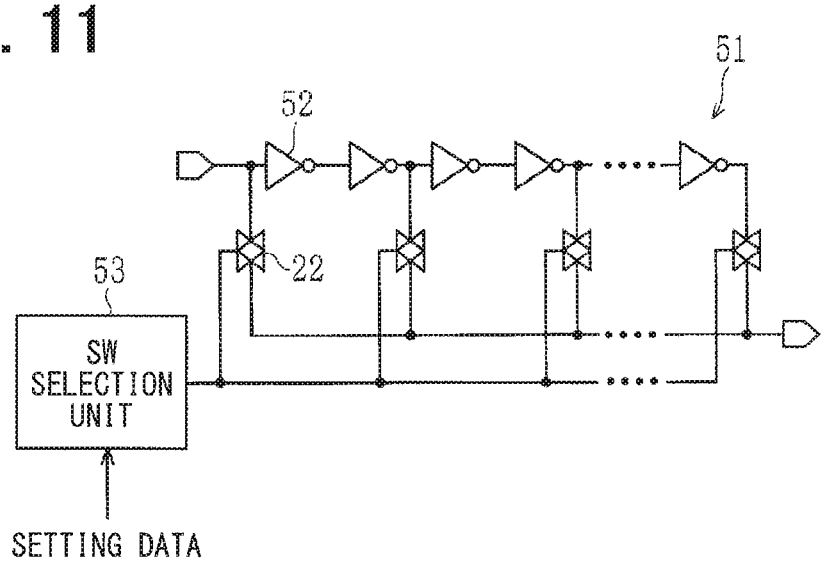
FIG. 11 is a diagram illustrating an electrical configuration of a delay circuit according to a fourth embodiment.

In a delay circuit 51 of the fourth embodiment illustrated in FIG. 11, an even number of NOT gates 52 (delay elements) are connected in series, and switch circuits 22 are disposed on an input terminal of the first-stage NOT gate 52 (an input terminal of the delay circuit 51) and output terminals of the even-numbered NOT gates 52. Ends of the switch circuits 22 that are not connected to the NOT gates 52 are connected in common to serve as an output terminal of the delay circuit 51. An SW selection unit 53 performs on/off control for the switch circuits 22.

The SW selection unit 53 turns on only any one of the switch circuits 22 according to an input setting data value to set a delay time. When the setting data value is small, the switch circuit 22 closer to the input terminal is turned on to reduce the delay time. As the setting data value increases, the switch circuit 22 closer to the output terminal is turned on to increase the delay time.

As described above, according to the fourth embodiment, the delay circuit 51 includes the even number of NOT gates 52 which are connected in series and the switch circuits 22 which are connected to the output terminals of the even-numbered NOT gates 52. Thus, the same effect as that of each of the above embodiments can be obtained.

Fifth Embodiment

Figure 12:
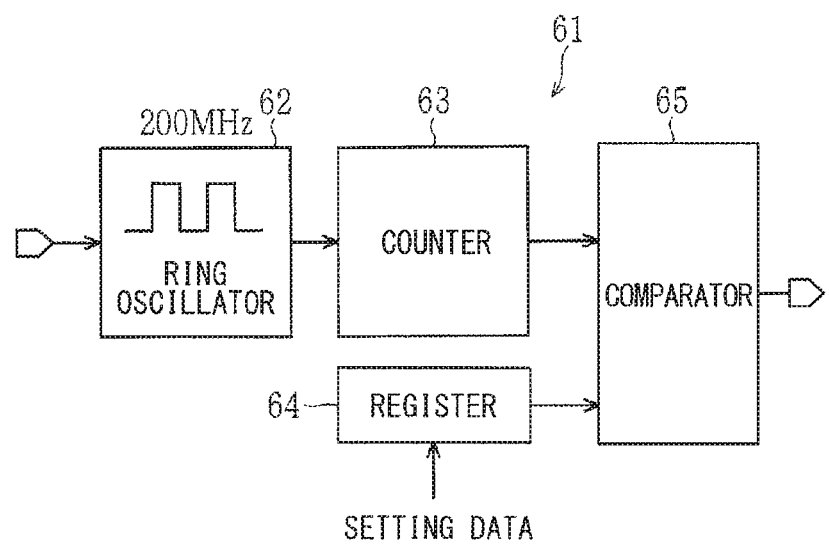
FIG. 12 is a diagram illustrating an electrical configuration of a delay circuit according to a fifth embodiment.

A delay circuit 61 of the fifth embodiment illustrated in FIG. 12 is provided with a ring oscillator 62, a counter 63, a data register 64, and a comparator 65. The ring oscillator 62 starts an oscillation operation (with an oscillatory frequency of 200 MHz, for example) when a rise detection signal is input. The counter 63 performs a count operation in response to a clock signal input from the ring oscillator 62. Setting data of a delay time is stored in the data register 64. The comparator 65 outputs a change timing signal when a count value of the counter 63 matches a data value stored in the data register 64.

As described above, according to the fifth embodiment, the delay circuit 61 includes the counter 63 which performs a count operation in response to a clock signal of a predetermined period and the comparator 65 which compares the counter value of the counter 63 with the delay time corresponding value. Thus, the same effect as that of each of the above embodiments can be obtained. An oscillator circuit using a crystal oscillator may be disposed instead of the ring oscillator 62.

The present disclosure is not limited only to the embodiments described above or illustrated in the drawings, and a modification or an expansion as described below may be made.

A relationship between high/low of the drive signal level and on/off of the IGBT 3 may be reversed.

The voltage-driven semiconductor element is not limited to an IGBT, and may be, for example, a MOSFET.

When the microcomputer 2 can be connected to the gate drive circuit during adjustment, the pulse generation circuit 8 is not required.

The setting of the estimated terminal voltage VT is not limited to setting using Equation (1).

In the drawings, the gate drive circuit is denoted by 1, the IGBT (the voltage-driven semiconductor element) is denoted by 3, the constant-current drive unit (the conduction control unit) is denoted by 4, the rise detection unit is denoted by 5, the delay circuit (the timing signal output unit, the delay time setting device) is denoted by 6, the delay time setting unit (the delay time setting device) is denoted by 7, and the comparator is denoted by 9.

It is noted that a flowchart or the processing of the flowchart in the present application includes sections (also referred to as steps), each of which is represented, for instance, as S1. Further, each section can be divided into several sub-sections while several sections can be combined into a single section. Furthermore, each of thus configured sections can be also referred to as a device, module, or means.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A timing adjustment method for a drive circuit, the drive circuit including:
   a rise detection unit that detects a rise start of an inter-conduction-terminal voltage of a voltage-driven semiconductor element when the voltage-driven semiconductor element is turned off;
   a timing signal output unit that outputs a speed change timing signal after a set delay time has elapsed from detection of the rise start; and
   a conduction control unit that initially discharges a conduction control terminal of the voltage-driven semiconductor element at a high speed, and changes a discharge speed to a low speed after the speed change timing signal is input, when the voltage-driven semiconductor element is turned off in response to an input drive signal,
   the timing adjustment method of adjusting a delay time set to the timing signal output unit, the method comprising:
   defining a time interval, from the rise start of the inter-conduction terminal voltage until the inter-conduction terminal voltage reaches a power supply voltage supplied to a high-potential side conduction terminal, as a rise completion time; defining a voltage of the conduction control terminal, estimated at time point when the rise completion time elapses, as an estimated terminal voltage;
   outputting the drive signal, having a level for turning off the voltage-driven semiconductor element, from a pulse generation circuit to the driving circuit for a predetermined time period when a test mode signal is at a high level;
   increasing a delay time, set to the timing signal output unit, by a predetermined unit time, and changing the drive signal, outputted from the pulse generation circuit, to a level for turning off the voltage-driven semiconductor element again, when the voltage of the conduction control terminal does not fall below the estimated terminal voltage after the drive signal is changed to a level for turning off the voltage-driven semiconductor element before the level is inverted; and
   determining a delay time, set at a time point when the voltage of the conduction control terminal falls below the estimated terminal voltage for the first time, as a value fixedly set to the timing signal output unit.

2. The timing adjustment method for the drive circuit according to claim 1, wherein:
   the power supply voltage used by the conduction control unit for performing a discharge operation is defined as VB;
   a feedback capacitance of the voltage-driven semiconductor element is defined as Crss;

an input capacitance of the voltage-driven semiconductor element is defined as Ciss;

the estimated terminal voltage is defined as VT; and

VT is determined by an equation of VT=VB−VH×Crss/Ciss.

3. A timing adjustment circuit for a drive circuit, the drive circuit including:
- a rise detection unit that detects a rise start of an inter-conduction-terminal voltage of a voltage-driven semiconductor element when the voltage-driven semiconductor element is turned off;
- a timing signal output unit that outputs a speed change timing signal after a set delay time has elapsed from detection of the rise start; and
- a conduction control unit that initially discharges a conduction control terminal of the voltage-driven semiconductor element at a high speed, and changes a discharge speed to a low speed after the speed change timing signal is input, when the voltage-driven semiconductor element is turned off in response to an input drive signal, the timing adjustment circuit of adjusting a delay time set to the timing signal output unit, the circuit comprising:
- a pulse generation circuit that outputs the drive signal, having a level for turning off the voltage-driven semiconductor element, to the driving circuit for a predetermined time period when a test mode signal is at a high level;
- a comparator that outputs a detection signal when a voltage of the conduction control terminal falls below an estimated terminal voltage, wherein the estimated terminal voltage is obtained by estimating a voltage of the conduction control terminal at a time point when a rise completion time elapses, and a time interval, from the rise start of the inter-conduction terminal voltage until the inter-conduction-terminal voltage reaches a power supply voltage supplied to a high-potential side conduction terminal, is defined as the rise completion time when the voltage-driven semiconductor element is turned off; and a delay time setting device that:
- increases a delay time, set to the timing signal output unit, by a predetermined unit time when the detection signal is not output after the drive signal, outputted from the pulse generation circuit, is changed to a level for turning off the voltage-driven semiconductor element before the level is inverted; and
- fixedly sets the delay time, set at a time point when the detection signal is output for the first time, to the timing signal output unit.

4. The timing adjustment circuit for the drive circuit according to claim 3, wherein:

the power supply voltage used by the conduction control unit for performing a discharge operation is defined as VB;

a feedback capacitance of the voltage-driven semiconductor element is defined as Crss;

an input capacitance of the voltage-driven semiconductor element is defined as Ciss;

the estimated terminal voltage is defined as VT; and

VT is determined by an equation of VT=VB−VH×Crss/Ciss.

5. The timing adjustment circuit for the drive circuit according to claim 3, wherein:

the delay time setting device includes a data register, a memory, a selector, and a delay circuit; and the delay time setting device is configured to:
- increase the unit time by increasing a data value corresponding to the delay time, set to the data register, by a predetermined value while a signal indicative of a timing adjustment period is input, and output a data value of the data register to the delay circuit through the selector;
- write the data value of the data register into the memory when the detection signal is output for the first time; and
- output a data value, written into the memory, to the delay circuit through the selector when an input of the signal indicative of the timing adjustment period is stopped.

6. The timing adjustment circuit for the drive circuit according to claim 3, wherein:

the delay time setting device includes a delay circuit that changes the delay time by changing a CR time constant according to a setting of the delay time.

7. The timing adjustment circuit for the drive circuit according to claim 3, wherein:

the delay time setting device includes: a series circuit of a variable current source and a capacitor; and a delay circuit that changes the delay time by changing a current value of the variable current source according to a setting of the delay time.

8. The timing adjustment circuit for the drive circuit according to claim 3, wherein:

the delay time setting device includes: a plurality of delay elements connected in series with each other; a plurality of switch circuits respectively connected between output terminals of the delay elements; and a delay circuit that changes the delay time by turning on only one of the switch circuits according to a setting of the delay time.

9. The timing adjustment circuit for the drive circuit according to claim 3, wherein:

the delay time setting device includes a delay circuit; and the delay circuit includes: a counter that performs a count operation in response to a clock signal of a predetermined period; and a comparator that compares a counter value of the counter with a value corresponding to the delay time.

* * * * *